United States Patent
Rafi

(10) Patent No.: US 7,379,723 B2
(45) Date of Patent: May 27, 2008

(54) LOCAL OSCILLATOR AND MIXER FOR TRANSCEIVER

(75) Inventor: Aslam Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 765 days.

(21) Appl. No.: 10/901,508

(22) Filed: Jul. 29, 2004

(65) Prior Publication Data

US 2006/0025095 A1 Feb. 2, 2006

(51) Int. Cl.
*H04B 1/26* (2006.01)

(52) U.S. Cl. .............. 455/216; 455/318; 455/323; 327/113; 375/322

(58) Field of Classification Search ............ 455/216, 455/318, 323, 113, 302, 324, 334; 327/100, 327/113, 116, 117; 375/322, 324, 334
See application file for complete search history.

(56) References Cited

U.S. PATENT DOCUMENTS

| | | | | |
|---|---|---|---|---|
| 4,315,165 | A | 2/1982 | Shimizu et al. ............ | 377/120 |
| 4,623,801 | A | 11/1986 | Rocchi ...................... | 327/115 |
| 4,645,649 | A | 2/1987 | Nagao ....................... | 422/186.3 |
| 4,902,909 | A | 2/1990 | Chantepie .................. | 327/115 |
| 5,030,951 | A * | 7/1991 | Eda et al. ................... | 341/100 |
| 5,172,400 | A | 12/1992 | Maemura .................... | 377/116 |
| 6,560,449 | B1 | 5/2003 | Liu ............................ | 455/302 |
| 6,707,326 | B1 | 3/2004 | Magoon et al. ............. | 327/115 |
| 6,785,528 | B2 * | 8/2004 | Carpineto ................... | 455/323 |
| 7,010,287 | B2 * | 3/2006 | Oh et al. ..................... | 455/318 |
| 2002/0171458 | A1 | 11/2002 | Hirano ...................... | 327/115 |

FOREIGN PATENT DOCUMENTS

| JP | 06 097818 | 4/1994 |
|---|---|---|
| JP | 2003 133946 | 5/2003 |
| TW | 00515142 | 12/2002 |

OTHER PUBLICATIONS

English language translation of Official Letter dated Jul. 26, 2007 from The Intellectual Property Bureau Ministry of Economic Affairs, pp. 1-2.
"Product Brief: Aero™ II GSM/GPRS Transceiver" Silicon Laboratories. Jun. 2004.
"Cellphone Design Using Highly integrated GSM Radio Chipset" Larry Li et al., International IC-Taipei Conference Proceedings, p. 5-11. May 2000.
"An Integrated I-Q Mixer for Software-Defined Radio Applications" Rick Campbell. *High Frequency Electronics*, pp. 26-33. Jan. 2004.

(Continued)

*Primary Examiner*—Tony T. Nguyen
(74) *Attorney, Agent, or Firm*—Trop, Pruner & Hu, P.C.

(57) ABSTRACT

In one embodiment, a local oscillator and mixer architecture may include a frequency divider having I and Q channel master storage elements formed of devices of a first size, and I and Q channel slave storage elements formed of devices of a second size, where the second size is smaller than the first size. In such manner, power consumption may be reduced while reducing phase noise in signals provided from the frequency divider to the corresponding mixer.

36 Claims, 4 Drawing Sheets

OTHER PUBLICATIONS

"Product Brief: Aero™/Aero=" Silicon Laboratories. Aug. 2002.
"Product Brief: Aero™/Aeroi=" Silicon Laboratories. Mar. 2003.
PCT/US2005/025171 International Search Report with Written Opinion of the International Searching Authority Mailed Oct. 18, 2005.

U.S. Appl. No. 10/930,709, filed Aug. 31, 2004, entitled "Matching I and Q Portions Of a Device" by Aslam Rafi; Donald Kerth.
Official Action dated Nov. 8, 2007 from the European Patent Office, pp. 1-4.

* cited by examiner

LOCAL OSCILLATOR AND MIXER FOR TRANSCEIVER

FIELD OF THE INVENTION

The present invention relates to circuitry used in an integrated circuit (IC), and more particularly to circuitry used in generating frequencies used for processing of quadrature signals.

BACKGROUND

In various systems including receivers, tuners, radios, cellular telephones and the like, a down conversion process occurs in which a received signal at a very high frequency, such as a radio frequency (RF) is received and processed to obtain a lower frequency signal to be used for further processing. Such lower frequency signals may include an intermediate frequency (IF) signal, such as a low IF signal. In other systems, a RF signal may be directly downconverted to a zero IF signal.

Typically, such down conversion is effected by taking a received signal at a first frequency (typically RF) and mixing it with a local oscillator (LO) frequency to obtain a desired IF or other lower frequency signal. In certain systems, the LO frequency may be generated using a crystal oscillator or other such reference frequency generator. Often, such a frequency is provided to a frequency divider, where the reference frequency is divided by either a fixed or programmable amount. The divided frequency may then be provided to a mixer for mixing with a received signal.

In systems using quadrature signals (i.e., an in-phase (I) signal and a quadrature-phase signal (Q)), the LO signals provided to the mixer are preferably low noise signals, as the noise created in generating the LO frequency such as via a frequency divider and a voltage controlled oscillator (VCO) can adversely affect receiver performance. For example, if a divide by two frequency divider is present, noise and other interference may exist, such as second harmonics of the divided frequency. Accordingly, oftentimes for RF communications a divide by four frequency divider is used. Such frequency dividers also suffer from noise problems and require a high frequency VCO with buffers capable of driving large capacitances at high frequencies, such that the VCO consumes high power. Furthermore, outputs from such a frequency divider may be jittery, causing a modulation in terms of phase that may appear as phase noise.

Similarly, a frequency divider used in developing a LO frequency should be well matched between its I and Q sides, as mismatches can cause a phase error and therefore image rejection degradation. The image rejection of a frequency divider (and more specifically the image rejection of a receiver including the divider) refers to the ability to reject responses resulting from RF signals at a frequency offset from the desired RF carrier frequency by an amount equal to twice the IF of the receiver.

Still further, a frequency divider should be well shielded, as 45° phase-shifted signals are present inside the frequency divider and an asymmetric coupling between the signals can cause degradation. Also, a frequency divider should consume low power, particularly where the circuitry operates at gigahertz frequencies.

However, these different criteria lead to expensive and inefficient designs, particularly with respect to power consumption. Thus a need exists for a frequency divider that can provide desired frequencies while maintaining low power and accurate operation.

SUMMARY OF THE INVENTION

In one aspect, the present invention includes a frequency divider that has an I channel master storage element formed of devices of a first size and an I channel slave storage element coupled to an output of the I channel master storage element formed of devices of a second size, the second size smaller than the first size. The frequency divider also includes a Q channel master storage element coupled to an output of the I channel slave storage element formed of devices of the first size and a Q channel slave storage element coupled to an output of the Q channel master storage element formed of devices of the second size. Using such a frequency divider, power consumption may be reduced while providing frequency divided phases with reduced phase noise.

In another aspect, the present invention includes an apparatus having a frequency divider with a first I channel having first and second latches and a first Q channel coupled to the first I channel having first and second latches, where the first latches are stronger than the second latches. The frequency divider may provide outputs to a quadrature mixer for mixing with incoming RF signals.

Yet another aspect of the invention resides in a system including a transceiver having first I and Q channels of a frequency divider each having first and second latches, where the first latches are larger than the second latches. The transceiver may further include first I and Q channel mixers to receive I and Q channel phases from the first I and Q channels of the frequency divider. The system may further include an antenna coupled to the transceiver to receive and transmit information and a processor coupled to the transceiver to process the information. Such a system may operate at high frequencies with reduced power consumption while reducing phase noise between the different phases generated by the I and Q channels.

Still another aspect of the present invention includes generating I and Q channel clean outputs from jittery inputs. The jittery inputs may be caused by latches formed of weaker devices, while latches formed of stronger devices may be used to generate the clean outputs. The clean outputs may be provided to a mixer for use in mixing with incoming RF signals.

DETAILED DESCRIPTION

Figure 1:
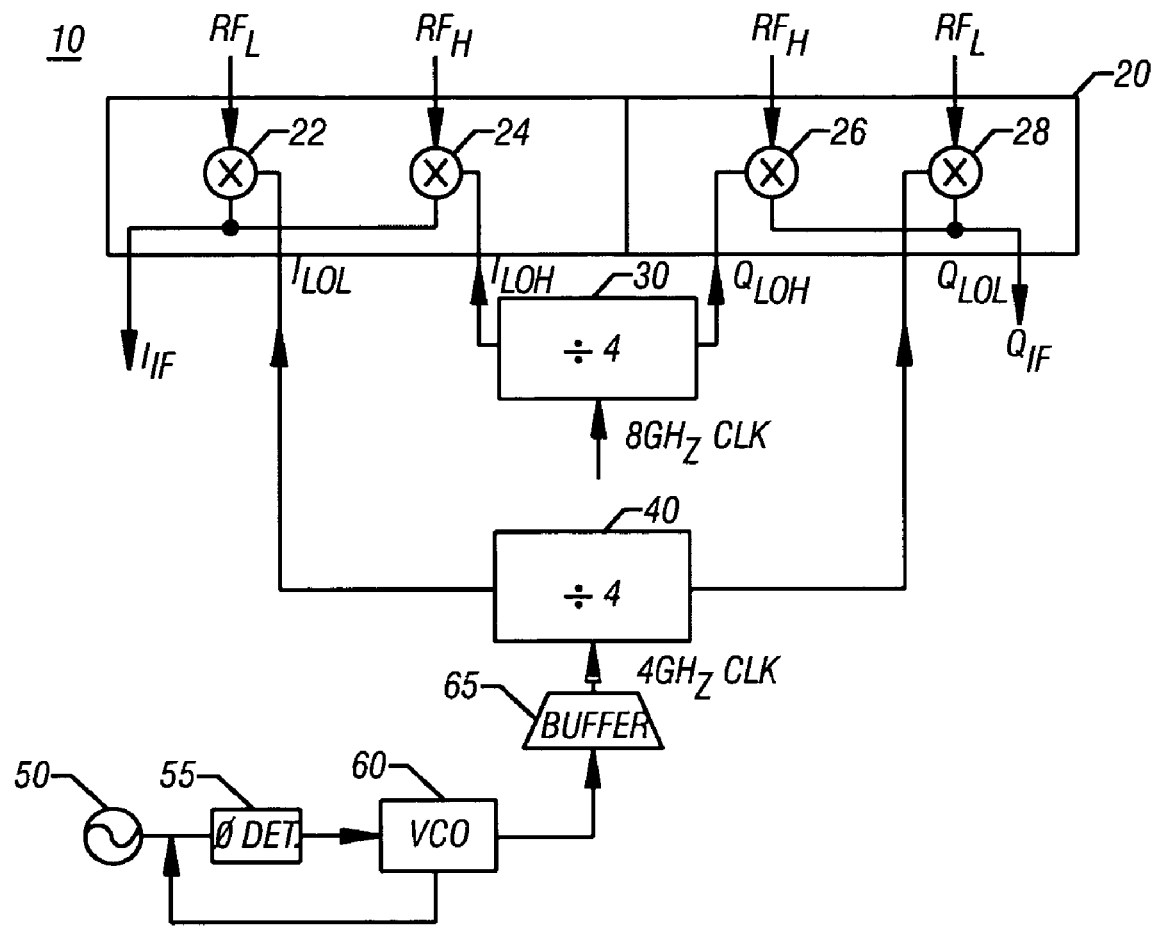
FIG. 1 is a block diagram of a portion of a system in accordance with one embodiment of the present invention.

Referring to FIG. 1, shown is a block diagram of a portion of a system in accordance with one embodiment of the present invention. More specifically, as shown in FIG. 1, a local oscillator and mixer portion of a system is shown. As used herein, the term "lomix" refers to a local oscillator and a mixer. As shown in FIG. 1, lomix 10 includes a quadrature mixer 20, a first frequency divider 30, and a second frequency divider 40. As shown in the embodiment of FIG. 1, frequency dividers 30 and 40 may be divide by four frequency dividers, although the scope of the present invention is not so limited.

Also shown in FIG. 1 are components that provide a clock input into frequency divider 40. These components include a crystal oscillator 50 that provides a reference frequency to a phase detector 55, which in turn is coupled to a VCO 60. Based on control signals provided by phase detector 55 and the feedback from VCO 60, the VCO provides a controlled LO frequency through a buffer 65 to frequency divider 40. In such manner, a phase locked loop (PLL) may be formed that attempts to lock the output of VCO 60 to a desired frequency value. For example, in one embodiment, a fractional-N PLL may be present to provide different frequencies to buffer 65. Furthermore, it is to be understood that while such components are shown as coupled to frequency divider 40, these components (albeit operating at a different frequency) may similarly be coupled to frequency divider 30. While shown in FIG. 1 as including such components, it is to be understood that in other embodiments different manners of providing clock signals to a frequency divider may be effected.

In operation, lomix 10 may receive RF signals on either a low frequency RF input ($RF_L$) or a high frequency RF input ($RF_H$). Such signals may be provided to both an I channel and a Q channel of quadrature mixer 20. In certain embodiments, high RF signals may be at a frequency of between approximately 1.8 and 2 gigahertz (GHz). For example, such high RF signals may be at a frequency of approximately 1.9 GHz for a Personal Communication System (PCS), or at approximately a 1.84 GHz frequency for a Digital Cellular System (DCS), although the scope of the present invention is not so limited. In certain embodiments, low RF signals may be at a frequency of between approximately 800 megahertz (MHz) to one GHz. For example, low RF signals may be at a frequency of approximately 850 MHz for a Global System for Mobile Communications (GSM) system, or at a 900 MHz frequency for a cellular telephone using an Extended GSM (EGSM) system, although the scope of the present invention is not so limited.

As shown in FIG. 1, low RF signals may be coupled to an I channel mixer 22 and a Q channel mixer 28, while high RF signals may be coupled to an I channel mixer 24 and a Q channel mixer 26. Further coupled to I channel mixer 22 and Q channel mixer 28 are outputs of frequency divider 40 (i.e., $I_{LOL}$ and $Q_{LOL}$). I and Q mixers 22 and 28 may mix the incoming signals with the respective LO frequency to obtain respective IF signals, namely $I_{IF}$ and $Q_{IF}$. In certain embodiments, the outputs of frequency divider 40 may be a 1 GHz LO frequency. That is, as shown in FIG. 1, frequency divider 40 may receive a buffered clock signal of 4 GHz and in turn output quadrature LO signals of 1 GHz. While shown as using a 1 GHz LO frequency, it is to be understood that the scope of the present invention is not so limited, and in other embodiments, a different LO frequency may be provided to mixers 22 and 28 to generate IF signals of different frequencies. In certain embodiments, low IF signals of approximately 100 to 300 kilohertz (KHz) may be generated and provided to other circuitry for further processing.

Similarly, high RF signals may be coupled to I channel mixer 24 and Q channel mixer 26 for mixing with the outputs of frequency divider 30 (namely $I_{LOH}$ and $Q_{LOH}$). In such manner, mixers 24 and 26 may provide quadrature IF signals (namely $I_{IF}$ and $Q_{IF}$) for further processing. In the embodiment shown in FIG. 1, frequency divider 30 may receive a buffered input clock frequency of 8 GHz and generate quadrature LO signals of 2 GHz to I channel mixer 24 and Q channel mixer 26. In such manner, low IF signals may be generated therefrom. The low IF signals may be between approximately 100-300 KHz in certain embodiments.

Because lomix 10 of FIG. 1 operates at very high frequencies (e.g., 4 and 8 GHz clocks), low power operation is desirable. Accordingly, frequency dividers 30 and 40 may be formed using a combination of strong and weak storage elements, such as latches. For example, in order to provide clean outputs from the frequency dividers, larger higher power devices may be used in one portion of the divider, while smaller lower power devices may be used in other portions of the dividers for phases that are not provided out of the frequency dividers. That is, in various embodiments, outputs from stages of a frequency divider to be provided to a quadrature mixer may be generated from strong latches, while stages not being provided out of the frequency divider may be formed of weak latches.

Many frequency dividers, including common divide by four dividers, may be formed using a plurality of latches, such as D-type flip-flops (DFF). Such flip-flops may be coupled in a master and slave relationship, with an output from the master and an output from the slave providing I and Q channel phases. Furthermore, an output of the slave may be fed back as an input to the master to form the circuit.

Oftentimes in such an arrangement, a DFF may receive a jittery input. Such an input may be modulated in phase, causing phase noise on the input to the DFF. However, so long as the clock input (CLK) to the DFF is a clean clock signal, a cleaner output may be generated from the DFF. A DFF is itself formed of a master latch and a slave latch, and the D-input of the master latch is driven by the output of the slave latch. Therefore, by making a master latch a stronger version of an associated slave latch, power may be saved, and may lead to appreciable power savings at higher operating frequencies.

Figure 2:
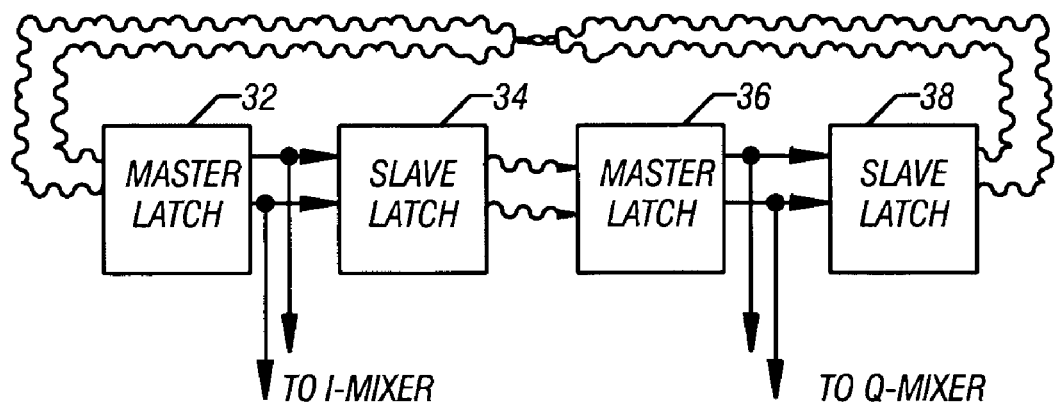
FIG. 2 is a block diagram of a frequency divider in accordance with one embodiment of the present invention.

Referring now to FIG. 2, shown is a block diagram of a frequency divider in accordance with one embodiment of the present invention. As shown in FIG. 2, frequency divider 30 may be the same as frequency divider 30 of FIG. 1. Frequency divider 30 may be formed of a master latch 32, which is coupled to a slave latch 34, which in turn is coupled to a master latch 36 that in turn is coupled to a slave latch 38. As further shown in FIG. 2, the outputs of slave latch 38 may be cross-coupled to the inputs of master latch 32 to form a loop therebetween.

In the embodiment of FIG. 2, master latches 32 and 36 may be strong, that is a latch formed using larger devices than the devices used to form slave latches 34 and 38. In various embodiments, the relative sizes of the devices used to form master latches and slave latches may vary. For example, in an embodiment used in a divide by four circuit that operates at a clock frequency of 8 GHz (i.e., a high RF band), the stronger latches may be approximately two times (2×) the size of the devices that form the slave latches, although the scope of the present invention is not so limited. In an embodiment used in a divide by four circuit that operates at a clock frequency of 4 GHz (i.e., a low RF band), the stronger latches may be approximately three times (3×) the size of the devices that form the slave latches, although the scope of the present invention is not so limited.

Because process technology typically does not perfectly match devices, even devices on the same die, some degree of mismatch between the I and Q channels may exist. In general, the mismatch between semiconductor devices on a common die or substrate is dependent on the physical size of the devices. This dependency may be predicted by the following relationship that quantifies the standard deviation (e.g., of threshold voltage or beta (β)) for a MOS device:

$$\sigma = \frac{\sigma_0}{\sqrt{W \times L}} \qquad [1]$$

where W×L (width times length) is total area occupied by the device on the semiconductor substrate, and $\sigma_0$ is a baseline measurement of deviation for a given device.

As is apparent from the above, deviations in critical CMOS device parameters vary inversely to the area occupied by the device. Thus larger devices have a smaller standard deviation than smaller devices. Accordingly, larger device geometries may be used for the devices that form the strong latches and provide outputs to an associated quadrature mixer. Accordingly, mismatch in these outputs may be minimized.

Thus as further shown in FIG. 2, the output of master latches 32 and 36 are clean outputs, meaning the outputs are either free of phase noise or have phase noise substantially reduced because of the size of the devices therein. In contrast, the outputs of slave latches 34 and 38 are jittery outputs, as they suffer from a phase noise penalty. However, because the outputs from these latches are not provided to an associated mixer, the noise is manageable. This is so, as the master latches to which the slaves are coupled can convert the jittery inputs to clean outputs, so long as the master latches are clocked with a clean clock signal.

While shown in the embodiment of FIG. 2 with strong master latches and outputs therefrom being provided to the quadrature mixer, in other embodiments the slave latches may be made stronger than the master latches and the outputs therefrom instead routed to the quadrature mixers.

In such manner, because the stronger latches use bigger devices, and therefore suffer from lesser beta and threshold voltage ($V_T$) mismatches, the outputs therefrom may be in better quadrature alignment. Furthermore, because weak latches are used for the slave latches, power consumption may be reduced by more than 30%, particularly in embodiments operating at a RF band. Also, because weak devices are used for at least certain portions of the frequency divider, parasitic capacitance on clock traces provided to the devices may be reduced, resulting in significant power savings for the buffer that drives the clock signal to the frequency divider.

Figure 3:
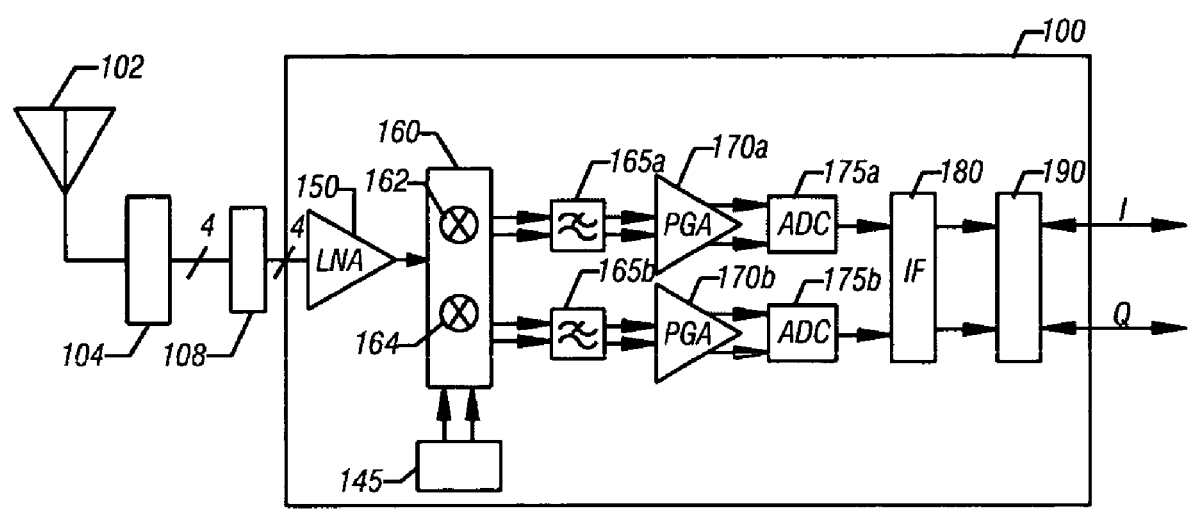
FIG. 3 is a block diagram of a transceiver in accordance with one embodiment of the present invention.

Referring now to FIG. 3, shown is block diagram of a transceiver in accordance with one embodiment of the present invention. Such a transceiver may be a CMOS transceiver for quad-band GSM/GPRS wireless communications such as for use in cellular handsets and wireless data modems, although the scope of the present invention is not so limited.

As shown in FIG. 3, incoming RF signals may be received by an antenna 102 and passed to an antenna switch 104. While different embodiments may be used with different RF communication devices, in one embodiment, incoming signals may be RF signals of a cellular telephone, and transceiver 100 may be a single chip transceiver for use in such a cell phone handset. Antenna switch 104 may be used to switch between incoming and outgoing signals from transceiver 100.

As shown in FIG. 3, one of a plurality of different bands may be input from antenna switch 104. Specifically, as shown in FIG. 3, a quad-band receiver may be present. For example, such a quad-band receiver may be adapted to receive GSM, EGSM, DCS, and PCS signals, although the scope of the present invention is not so limited. In other embodiments, transceiver 100 may be used in a General Packet Radio Service (GPRS) device, a satellite tuner, or a wireless local area network (WLAN) device, for example.

Such incoming signals may pass through an external filter 108, such as a receive surface acoustic wave (SAW) filter bank, and be provided into transceiver 100, and more specifically to a low noise amplifier (LNA) 150. While shown as a single LNA, it is to be understood that multiple LNAs may be present to receive signals of the different bands. From there, incoming RF signals may be provided to a quadrature mixer 160 having an I channel mixer 162 and a Q channel mixer 164. While shown with single mixers per phase, it is to be understood that quadrature mixer 160 may include multiple mixers for each phase, as shown in FIG. 1, for example. Quadrature mixer 160 may receive I and Q LO inputs from a frequency divider and phase shifter 145, which may correspond to frequency dividers 30 and 40 shown in FIG. 1.

Still referring to FIG. 3, after quadrature mixer 160 downmixes the incoming RF signals to an intermediate frequency (IF), the I and Q channels may be routed to respective filters 165a and 165b and programmable gain amplifiers (PGA's) 170a and 170b. From there, the signals may be provided to analog-to-digital converters (ADC's) 175a and 175b for conversion to digital signals. The digital signals may then be provided to an IF block 180, for further downmixing and processing at a low IF frequency. Then the resulting baseband signals may be provided to an analog interface 190 for transmission to baseband components of a handset or other such device. While only the receive path is shown in FIG. 3, it is to be understood that similar components may be present within transceiver 100 to provide for reception of baseband signals from within the handset or other such device and conversion to RF signals for transmission via antenna 102.

While shown in FIG. 3 as including the particular components shown therein, it is to be understood that in other embodiments, transceiver 100 may include additional and/or different components, and the embodiment shown in FIG. 3 is for illustrative purposes.

Figure 4:
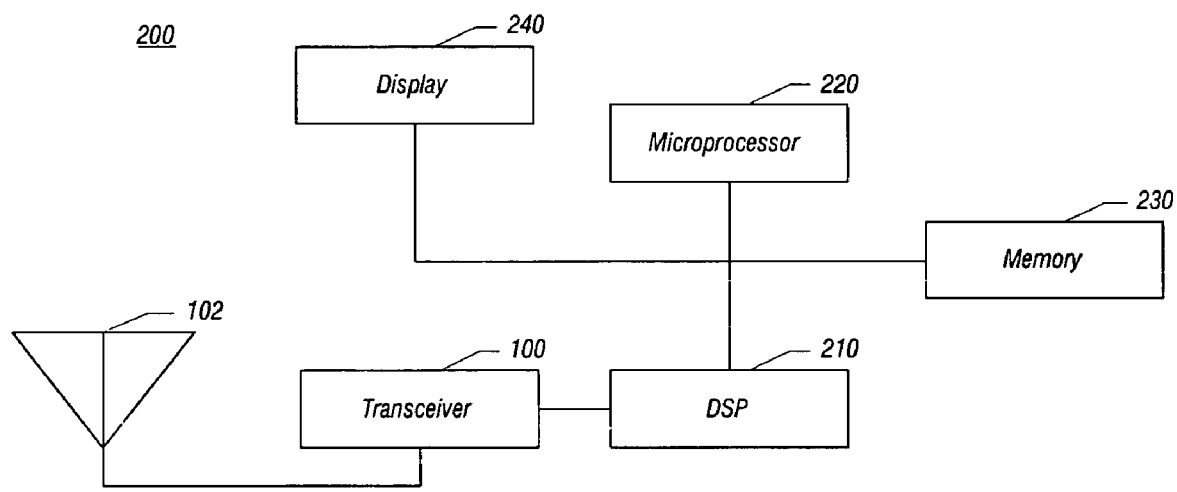
FIG. 4 is a block diagram of a system in accordance with one embodiment of the present invention.

Referring now to FIG. 4, shown is a block diagram of a system in accordance with one embodiment of the present invention. As shown in FIG. 4, system 200 may be a cellular telephone handset, although the scope of the present invention is not so limited. For example, in other embodiments, the system may be a pager, personal digital assistant (PDA) or other such device. As shown, antenna 102 may be coupled to a transceiver 100, such as the transceiver shown in FIG. 3. In turn, transceiver 100 may be coupled to a digital signal processor (DSP) 210, which may handle processing of baseband communication signals. In turn, DSP 210 may be coupled to a microprocessor 220, such as a central processing unit (CPU) that may be used to control operation of system 200 and further handle processing of application programs, such as personal information management (PIM) programs, email programs, downloaded games, and the like. Microprocessor 200 and DSP 210 may also be coupled to a memory 230. Memory 230 may include different memory components, such as a flash memory and a read only memory (ROM), although the scope of the present invention is not so limited. Furthermore, as shown in FIG. 4, a display 240 may be present to provide display of information associated with telephone calls and application programs.

Although the description makes reference to specific components of system 200, it is contemplated that numerous modifications and variations of the described and illustrated embodiments may be possible. It is to be understood that transceiver 100 may include one or more frequency dividers and quadrature mixers in accordance with an embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A frequency divider comprising:
   an I channel master storage element formed of devices of a first size;
   an I channel slave storage element coupled to an output of the I channel master storage element formed of devices of a second size, the second size smaller than the first size;
   a Q channel master storage element coupled to an output of the I channel slave storage element formed of devices of the first size; and
   a Q channel slave storage element coupled to an output of the Q channel master storage element formed of devices of the second size.

2. The frequency divider of claim 1, wherein the I channel master storage element comprises a strong latch and wherein the I channel slave storage element comprises a weak latch.

3. The frequency divider of claim 1, wherein the first size is at least approximately twice the second size.

4. The frequency divider of claim 1, wherein the output of the I channel master storage element is substantially cleaner than the output of the I channel slave storage element.

5. The frequency divider of claim 1, wherein the output of the I channel slave storage element comprises a jittery output.

6. The frequency divider of claim 1, further comprising a buffer coupled to provide a clock signal to the I channel master storage element and the Q channel master storage element.

7. An apparatus comprising:
   a first I channel of a frequency divider having a first latch and a second latch; and
   a first Q channel of the frequency divider coupled to the first I channel having a first latch and a second latch, wherein the first latches of the first I and Q channels are stronger than the second latches of the first I and Q channels.

8. The apparatus of claim 7, wherein outputs of the first latches of the first I and Q channels are coupled to a quadrature mixer.

9. The apparatus of claim 8, wherein the outputs of the first latches of the first I and Q channels are substantially cleaner than outputs of the second latches of the first I and Q channels.

10. The apparatus of claim 7, wherein the second latch of the first I channel is coupled to the first latch of the first Q channel and the second latch of the first Q channel is coupled to the first latch of the first I channel.

11. The apparatus of claim 10, wherein outputs of the second latches of the first I and Q channels comprise jittery outputs.

12. The apparatus of claim 7, further comprising a buffer coupled to provide a buffered clock signal to the first I channel and the first Q channel.

13. The apparatus of claim 12, further comprising a phase-locked loop coupled to provide a controlled clock signal to the buffer.

14. The apparatus of claim 13, wherein the phase-locked loop comprises a fractional-N phase-locked loop.

15. The apparatus of claim 7, wherein the first latches of the first I and Q channels are formed of devices having a first size, and the second latches of the first I and Q channels are formed of devices having a second size, the first size substantially greater than the second size.

16. The apparatus of claim 15, wherein the first size is at least approximately twice the second size.

17. The apparatus of claim 8, further comprising:
   a second I channel of the frequency divider having a third latch and a fourth latch; and
   a second Q channel of the frequency divider coupled to the second I channel having a third latch and a fourth latch, wherein the third latches of the second I and Q channels are stronger than the fourth latches of the second I and Q channels.

18. The apparatus of claim 17, wherein a first ratio between the size of devices forming the first latches and the second latches is different than a second ratio between the size of devices forming the third latches and the fourth latches.

19. The apparatus of claim 17, wherein outputs of the third latches of the second I and Q channels are coupled to the quadrature mixer.

20. The apparatus of claim 17, wherein the first I and Q channels to provide a first frequency to the quadrature mixer, and the second I and Q channels to provide a second frequency to the quadrature mixer.

21. The apparatus of claim 20, wherein the quadrature mixer to use the first frequency or the second frequency to mix with an incoming signal, based upon the incoming signal.

22. An apparatus comprising:
   a first I channel of a frequency divider having a first latch and a second latch;
   a first Q channel of the frequency divider coupled to the first I channel having a first latch and a second latch, wherein the first latches of the first I and Q channels are stronger than the second latches of the first I and Q channels;
   a first I channel mixer to receive a first I channel phase from the first I channel; and
   a first Q channel mixer to receive a first Q channel phase from the first Q channel.

23. The apparatus of claim 22, further comprising:
   a second I channel of the frequency divider having a third latch and a fourth latch; and
   a second Q channel of the frequency divider coupled to the second I channel having a third latch and a fourth latch, wherein the third latches of the second I and Q channels are stronger than the fourth latches of the second I and Q channels.

24. The apparatus of claim 23, further comprising:
   a second I channel mixer to receive a second I channel phase from the second I channel of the frequency divider; and
   a second Q channel mixer to receive a second Q channel phase from the second Q channel of the frequency divider.

25. The apparatus of claim 23, wherein a first ratio between the size of devices forming the first latches and the second latches is different than a second ratio between the size of devices forming the third latches and the fourth latches.

26. The apparatus of claim 22, wherein the apparatus comprises a global system for mobile communications/general packet radio service transceiver.

27. A system comprising:
a transceiver having:
a first I channel of a frequency divider having a first latch and a second latch,
a first Q channel of the frequency divider coupled to the first I channel having a first latch and a second latch, wherein the first latches of the first I and Q channels are larger than the second latches of the first I and Q channels,
a first I channel mixer to receive a first I channel phase from the first I channel of the frequency divider, and
a first Q channel mixer to receive a first Q channel phase from the first Q channel of the frequency divider;
an antenna coupled to the transceiver to receive and transmit information; and
a processor coupled to the transceiver.

28. The system of claim 27, further comprising:
a second I channel of the frequency divider having a third latch and a fourth latch; and
a second Q channel of the frequency divider coupled to the second I channel having a third latch and a fourth latch, wherein the third latches of the second I and Q channels are stronger than the fourth latches of the second I and Q channels.

29. The system of claim 28, further comprising:
a second I channel mixer to receive a second I channel phase from the second I channel of the frequency divider; and
a second Q channel mixer to receive a second Q channel phase from the second Q channel of the frequency divider.

30. The system of claim 27, wherein the transceiver comprises a global system for mobile communications/general packet radio service transceiver.

31. The system of claim 27, wherein the system comprises a cellular telephone.

32. A method comprising:
generating an I channel clean output in a first I channel stage of a frequency divider from a first jittery input;
providing the I channel clean output to a mixer;
generating a Q channel clean output in a first Q channel stage of the frequency divider from a second jittery input; and
providing the Q channel clean output to the mixer.

33. The method of claim 32, further comprising generating the first jittery input in a second Q channel stage of the frequency divider.

34. The method of claim 32, further comprising generating the second jittery input in a second I channel stage of the frequency divider.

35. The method of claim 34, wherein the first I channel stage comprises devices of a first size and the second I channel stage comprises devices of a second size, the first size substantially greater than the second size.

36. The method of claim 32, further comprising providing a clean clock signal to the first I channel stage and the first Q channel stage.

* * * * *